(12) United States Patent
Skeete

(10) Patent No.: US 9,368,535 B2
(45) Date of Patent: Jun. 14, 2016

(54) IMAGING SYSTEMS WITH FLIP CHIP BALL GRID ARRAYS

(71) Applicant: Semiconductor Components Industries, LLC, Phoenix, AZ (US)

(72) Inventor: Oswald Skeete, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 105 days.

(21) Appl. No.: 14/194,119

(22) Filed: Feb. 28, 2014

(65) Prior Publication Data

US 2015/0249105 A1 Sep. 3, 2015

(51) Int. Cl.
*H01L 27/146* (2006.01)
*H04N 5/225* (2006.01)

(52) U.S. Cl.
CPC ...... *H01L 27/14636* (2013.01); *H01L 27/1464* (2013.01); *H01L 27/1469* (2013.01); *H01L 27/14634* (2013.01); *H01L 27/14689* (2013.01); *H04N 5/2253* (2013.01); *H04N 5/2257* (2013.01)

(58) Field of Classification Search
CPC .................. H01L 27/14636; H01L 27/14634; H01L 27/1469; H01L 27/14689; H01L 27/1464; H04N 5/2253
See application file for complete search history.

(56) References Cited

U.S. PATENT DOCUMENTS

| | | | |
|---|---|---|---|
| 6,566,745 B1 * | 5/2003 | Beyne et al. ................... | 257/680 |
| 6,656,768 B2 | 12/2003 | Thomas | |
| 6,956,295 B2 | 10/2005 | Kinsman | |
| 7,411,306 B2 | 8/2008 | Leu et al. | |
| 7,417,293 B2 | 8/2008 | Chen et al. | |
| 7,544,529 B2 | 6/2009 | Chen et al. | |
| 8,232,633 B2 | 7/2012 | Yang | |
| 2005/0236684 A1 | 10/2005 | Chen et al. | |
| 2009/0309235 A1 * | 12/2009 | Suthiwongsunthorn et al. ............................. | 257/777 |
| 2012/0273908 A1 * | 11/2012 | Kinsman ........... H01L 27/14618 | 257/432 |
| 2013/0140664 A1 | 6/2013 | Lo et al. | |

FOREIGN PATENT DOCUMENTS

EP 1041628 10/2000

* cited by examiner

*Primary Examiner* — Twyler Haskins
*Assistant Examiner* — Padma Haliyur
(74) *Attorney, Agent, or Firm* — Treyz Law Group, P.C.; Jason Tsai

(57) ABSTRACT

An imaging system may include an integrated circuit package that includes an image sensor die mounted in a flip chip configuration to a package substrate. The image sensor die may be a backside illumination sensor die. The image sensor die may include an imaging device structure formed over a carrier layer. Through-silicon vias formed in the carrier layer may couple imaging device circuitry in the imaging device structure to conductive bumps on the carrier layer that are coupled to metal interconnects. A ball grid array may be formed on a surface of the package substrate that may be coupled to the conductive bumps. A glass lid may be attached to the image sensor die using attachment structures such that an air gap is formed between the glass lid and the image sensor die. Package sealing material may be deposited between the image sensor die and the package substrate.

18 Claims, 3 Drawing Sheets

IMAGING SYSTEMS WITH FLIP CHIP BALL GRID ARRAYS

BACKGROUND

This relates generally to imaging systems, and more particularly, to imaging systems with flip chip ball grid arrays.

Modern electronic devices such as cellular telephones, cameras, and computers often use digital image sensors. Imaging systems (i.e., image sensors) often include a two-dimensional array of image sensing pixels. Each pixel typically includes a photosensor such as a photodiode that receives incident photons (light) and converts the photons into electrical signals. The imaging system contains an image sensor die and a package substrate. The image sensor die includes an image sensor integrated circuit and an array photodiodes for the array of image sensing pixels. The image sensor die is mounted to the package substrate to form an integrated circuit package.

A bond pad on the image sensor die may be connected to circuitry in the substrate using a conductive bond wire. However, using a bond wire to couple the image sensor die to the circuitry in the substrate may limit the space on the surfaces of the image sensor die and the substrate due to the formation of bond pads on those surfaces.

It would therefore be desirable to provide improved ways of forming image sensor chip-scale packages.

DETAILED DESCRIPTION

Figure 1:
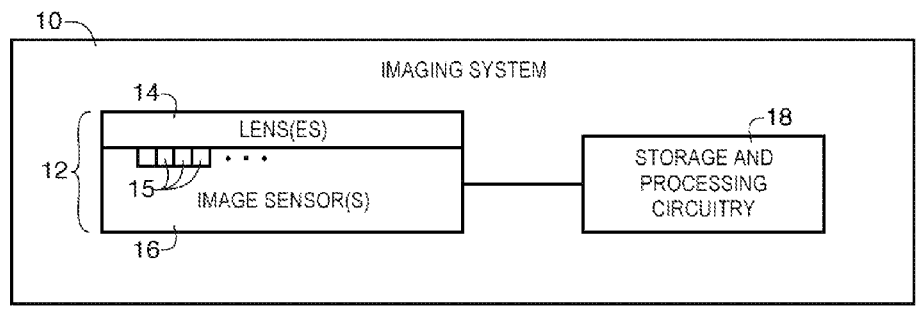
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may for example, be a backside illumination image sensor. If desired, camera module 12 may be provided with an array of lenses 14 and an array of corresponding image sensors 16. Image sensor 16 may include an array of image sensor pixels such as an array of image sensor pixels 15 and a corresponding array of optional color filter elements.

Processing circuitry 18 may include one or more integrated circuits (e.g., image processing circuits, microprocessors, storage devices such as random-access memory and non-volatile memory etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment a computer or other device) using wired and/or wireless communications paths coupled to processing circuitry 18.

Figure 2:
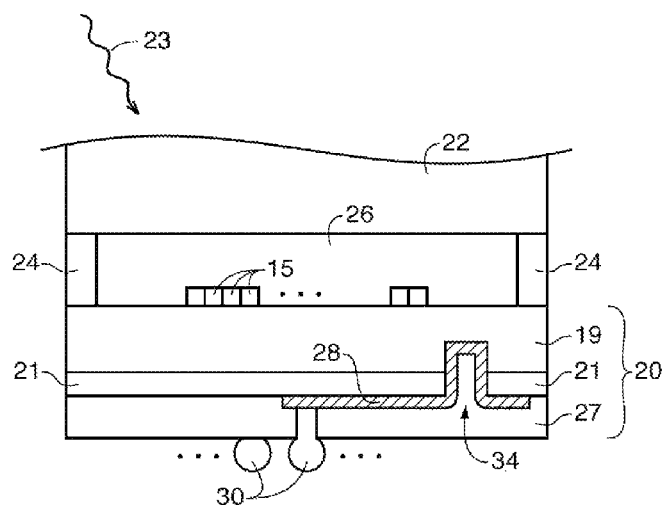
FIG. 2 is a cross-sectional side view of an image sensor die in accordance with an embodiment of the present invention.

In FIG. 2, an imaging device structure such as imaging device structure 19 may contain an array of image sensor pixels 15. Imaging device structure 19 may be formed from silicon material and may contain imaging device circuitry for operating image sensor pixels 15. Imaging device structure 19 may be formed over a carrier layer such as carrier layer 27 with one or more layers such as layer 21 interposed between imaging device structure 19 and carrier layer 27. Carrier layer 27 may also be formed from silicon material. Layer 21 may be formed from oxide or nitride materials and may be a passivation layer.

Imaging device structure 19, layer 21, and carrier layer 27 may form an image sensor die such as image sensor die 20. A glass layer or lid such as glass layer 22 may be mounted over imaging device structure 19. Light may pass through glass layer 22 and may reach image sensor pixels 15 from the direction indicated by arrow 23. Glass layer 22 may be attached to imaging device structure 19 using an attachment structure such as attachment structure 24 interposed between glass layer 22 and imaging device structure 19. Attachment structure 24 may be an adhesive layer or a spacer. Attachment structure 24 may be formed on a peripheral region of imaging device structure 19 prior to forming glass layer 22 over imaging device structure 19. Glass layer 22 and imaging device structure 19 may be separated by an air gap such as air gap 26. Image sensor pixels 15 may be formed on imaging device structure 19 in air gap 26.

Carrier layer 27 may include metal interconnect layers or metal routing paths such as metal interconnect 28. Metal interconnect 28 may be one of many metal routing paths in carrier layer 27. Through-silicon vias such as through-silicon vias 34 may be formed in carrier layer 27 to couple imaging device circuitry in imaging device structure 19 to metal interconnect 28 or other metal routing paths in carrier layer 27. One end of through-silicon via 34 may be coupled to imaging device circuitry for pixels 15 in imaging device structure 19 and the opposing end of through-silicon via 34 may be coupled to a respective metal interconnect 28 and respective conductive ball 30. Through-silicon vias 34 may be formed at a peripheral portion of carrier layer 27 (i.e. in a region of carrier layer 27 that does not directly lie below or overlap the array of image sensor pixels 15 in imaging device structure 19). This is merely exemplary; through-silicon vias 34 may be formed in any suitable location in carrier layer 27.

Conductive lumps such as conductive bumps 30 may be formed on a bottom surface of carrier layer 27 and may be coupled to metal interconnect 28. Conductive bumps 30 may be formed in any suitable arrangement to couple image sensor die 20 with another substrate. For example, conductive bumps 30 may be formed only on the peripheral regions of a bottom surface of carrier layer 27, or conductive bumps 30 may substantially cover the entire bottom surface of carrier layer 27. Conductive bumps 30 may be formed from copper material. Alternatively, conductive bumps may also be formed from solder balls.

Figure 3:
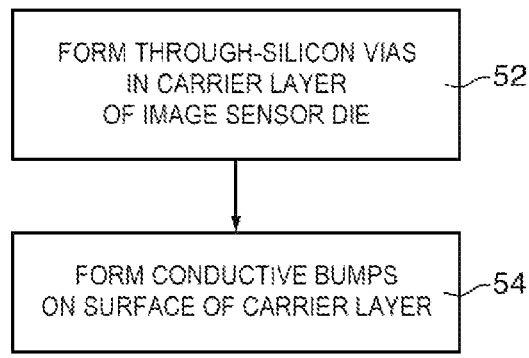
FIG. 3 is a flow chart of illustrative steps for forming the image sensor die of FIG. 2 in accordance with an embodiment of the present invention.

In FIG. 3, a flowchart of illustrative steps for forming an image sensor die such as image sensor die 20 of FIG. 2 is shown. Image sensor die 20 may have an imaging device structure such as imaging device structure 19 formed over a carrier layer such as carrier layer 27. Imaging device structure 19 may be formed from silicon material and may contain imagine device circuitry for operating image sensor pixels 15. Imaging device structure 19 may be formed over a carrier layer such as carrier layer 27 with one or more layers such as layer 21 interposed between imaging device structure 19 and carrier layer 27. Layer 21 may be formed from oxide or nitride materials and may be a passivation layer. Imaging device structure 19, layer 21, and carrier layer 27 may form an image sensor die such as image sensor die 20. Carrier layer 27 may also be formed from silicon material. Carrier layer 27 may include metal interconnect layers or metal routing paths such as metal interconnect 28. Metal interconnect 28 may be one of many metal routing paths in carrier layer 27.

At step 52, a through-silicon via such as through-silicon via 34 may be formed in the carrier layer. Through-silicon vias such as through-silicon vias 34 may be formed in carrier layer 27 to couple imaging device circuitry in imaging device structure 19 to metal interconnect 28 or other metal routing paths in carrier layer 27. One end of through-silicon via 34 may be coupled to imaging device circuitry for pixels 15 in imaging device structure 19 and the opposing end of through-silicon via 34 may be coupled to a respective metal interconnect 28 and respective conductive bump 30. Through-silicon vias 34 may be formed at a peripheral portion of carrier layer 27 (i.e. in a region of carrier layer 27 that does not directly lie below or overlap the array of image sensor pixels 15 in imaging device structure 19). This is merely exemplary; through-silicon vias 34 may be formed in any suitable location in carrier layer 27.

At step 54, conductive bumps such as conductive bumps 30 may be formed on a surface of the carrier layer. Conductive bumps 30 may be formed on a bottom surface of carrier layer 27 and may be coupled to metal interconnect 28. Conductive humps 30 may be formed in any suitable arrangement to couple image sensor die 20 with another substrate. For example, conductive bumps 30 may be formed only on the peripheral regions of a bottom surface of carrier layer 27, or conductive bumps 30 may substantially cover the entire bottom surface of carrier layer 27. Conductive bumps 30 may be formed from copper material. Alternatively, conductive bumps may also be formed from solder balls.

Figure 4:
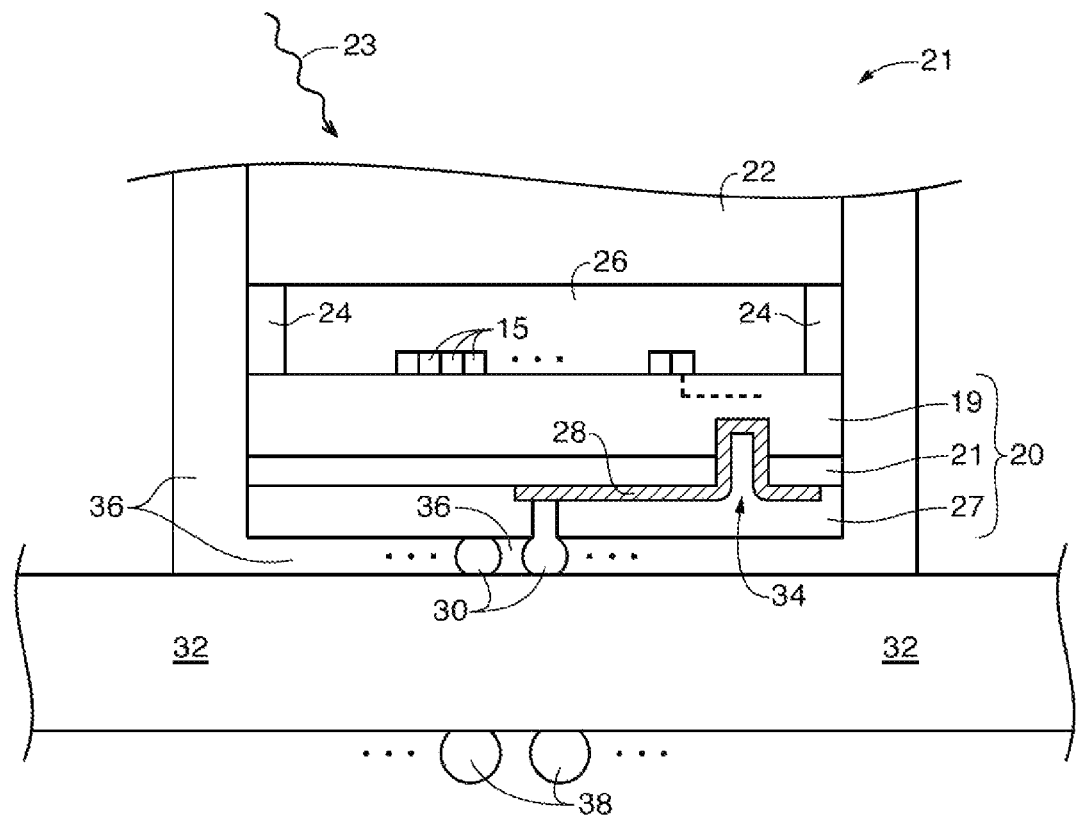
FIG. 4 is a cross-sectional side view of an integrated circuit package with the image sensor die of FIG. 2 in a flip chip configuration in accordance with an embodiment of the present invention.

As shown in FIG. 4, the image sensor die 20 of FIG. 2 may be mounted on a package substrate such as package substrate 32 to form an integrated circuit package such as integrated circuit package 21. Integrated circuit package 21 may be an image sensor chip-scale package. Package substrate 32 may be formed from a ceramic or organic material and may contain digital signal processing circuitry for processing signals received from image sensor die 20. Package substrate 32 may be an application-specific integrated circuit. Image sensor die 20 may be mounted on any suitable location of package substrate 32. Image sensor die 20 may be mounted in a flip chip configuration and may be a backside illuminated (BSI) image sensor.

Conductive bumps 30 of image sensor die 20 may contact a surface of package substrate 32 that faces image sensor die 20 (i.e. a top surface of package substrate 32). A solder ball grid array with a plurality of solder balls 38 may be formed on a surface of package substrate 32. Solder balls 38 may be coupled to a printed circuit board (not shown). Solder halls 38 may be coupled to conductive bumps 30 on the surface image sensor die 20 (e.g. by using vias). Unlike conventional wire-bonding methods, image sensor die 20 may be coupled to package substrate 32 without a redistribution layer formed on a surface of image sensor die 20. By forming through-silicon vias in carrier layer 27 of image sensor die 20 to couple imaging device circuitry in imaging device structure 19 to conductive bumps 30 on the surface of carrier layer 27, space on the surfaces of image sensor die 20 (specifically, imaging device structure 19) and package substrate 32 is conserved, as no additional bond pads are required on the surface of the image sensor die 20 (specifically, imaging device structure 19) and the surface of package substrate 32 (in contrast with conventional wire bonding methods of forming image sensor packages).

Package sealing material such as package sealing material 36 may be formed on package substrate 32 such that package sealing material 36 surrounds the sides of image sensor die 20 and glass layer 22. Package sealing material 36 may be used as underfill material and may be deposited between package substrate 32 and image sensor die 20 (i.e. package sealing material 36 may fill in the spaces between each conductive bump 30). Package sealing material 36 may be any suitable epoxy or resin material. Package sealing material 36 may provide protection and mechanical stability to integrated circuit package 21.

Figure 5:
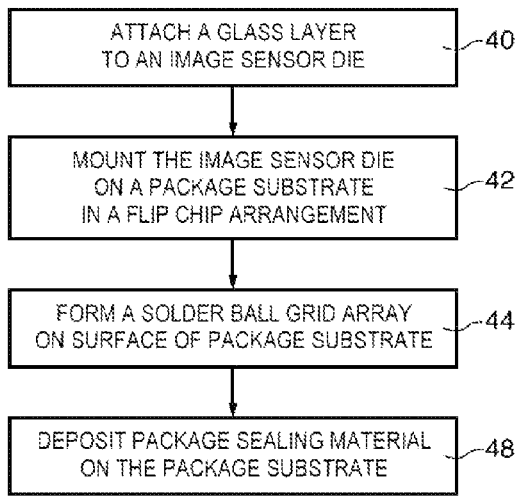
FIG. 5 is a flow chart of illustrative steps for forming the integrated circuit package of FIG. 4 in accordance with an embodiment of the present invention.

FIG. 5 is a now chart of illustrative steps for forming an integrated circuit package in FIG. 3.

At step 40, a glass layer such as glass layer 22 may be attached to an image sensor die such as image sensor die 20. Image sensor die 20 may be a BSI image sensor having an imaging device structure such as imaging device structure 19 formed over a carrier layer such as carrier layer 27. Light may pass through glass layer 22 and may reach image sensor pixels 15 from the direction indicated by arrow 23. Glass layer 22 may be attached to image sensor die 20 using an attachment structure such as attachment structure 24 interposed between glass layer 22 and image sensor die 20. Attachment structure 24 may be an adhesive layer or a spacer. Attachment structure 24 may be formed on a peripheral region of imaging device structure 19 prior to forming glass layer 22 over image sensor die 20. Glass layer 22 and image sensor die 20 may be separated by an air gap such as air gap 26. Image sensor pixels 15 may be formed on imaging device structure 19 in air gap 26.

At step 42, the image sensor die with the glass layer may be mounted on a package substrate such as package substrate 32 in a flip chip arrangement to form an integrated circuit package such as integrated circuit package 21. Integrated circuit package 21 may be an image sensor chip-scale package. Package substrate 32 may be formed from a ceramic or organic material and may contain digital signal processing circuitry for processing signals received from image sensor die 20. Package substrate 32 may be an application-specific integrated circuit. Image sensor die 20 may be mounted on any suitable location of package substrate 32. Conductive bumps 30 of image sensor die 20 may contact a surface of package substrate 32 that faces image sensor die 20 (i.e. a top surface of package substrate 32).

At step 44, a solder ball grid array with solder balls such as solder balls 34 may be formed on a surface of the package substrate. Solder balls 34 may be coupled to a printed circuit board (not shown). Conductive bumps 30 on image sensor 20 may be coupled to solder balls 34 (e.g. by using vias).

At step 48, package sealing material such as package sealing material 36 may be formed on the package substrate. Package sealing material such as package sealing material 36 may be formed on package substrate 32 such that package sealing material 36 surrounds the sides of image sensor die 20 and glass layer 22. Package sealing material 36 may be used as underfill material and may be deposited between package substrate 32 and image sensor die 20 (i.e. package sealing material 36 may fill in the spaces between each conductive bump 30). Package sealing material 36 may be any suitable epoxy or resin material. Package sealing material 36 may provide protection and mechanical stability to integrated circuit package 21.

Figure 6:
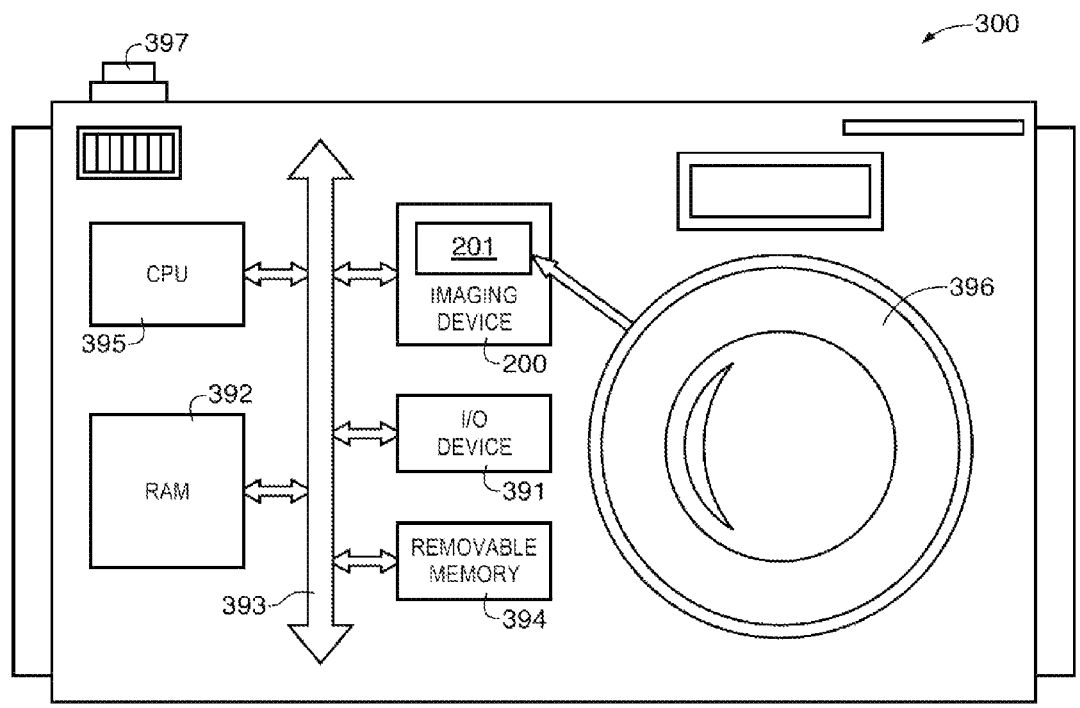
FIG. 6 is a block diagram of an imaging system employing the embodiment of FIG. 1 in accordance with an embodiment of the present invention.

FIG. 6 shows in simplified form a typical processor system 300, such as a digital camera, which includes an imaging device 200. Imaging device 200 may include an imaging device such as an electronic device 10 of FIG. 1 having an array 201 of image pixels 15. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating an integrated circuit package formed with a flip chip ball grid array. A system including a central processing unit, a memory, input-output circuitry, and an imaging device may include an integrated circuit package. The integrated circuit package may include a package substrate and an image sensor die mounted on the package substrate in a flip chip configuration. A solder ball grid array may be coupled to the package substrate. The image sensor die may include an imaging device structure formed over a carrier layer. The carrier layer may include metal interconnects that are coupled to the ball grid array. A plurality of conductive bumps may be interposed between the carrier layer and the package substrate and may contact the metal interconnects. Prior to mounting the image sensor die on the package substrate, a glass lid or layer may be attached to the image sensor die such that an air gap is formed between the glass lid and the image sensor die.

Package sealing material may be deposited on the package substrate and around the glass lid and the image sensor die. The package sealing material may at least partially surround the glass lid and the image sensor die. An attachment structure may be interposed between the glass lid and the image sensor die. The attachment structure may be an adhesive layer. Underfill material may be disposed between the image sensor die and the substrate and may be formed from the same material as the package sealing material. The image sensor die may be a backside illuminated (BSI) image sensor die. The plurality of conductive bumps may be connected to the ball grid array without redistribution layers formed at a surface of the image sensor die. The carrier layer of the image sensor die may include through silicon vias (TSVs), each of which has a first end connected to a respective one of the plurality of conductive bumps and a second end that is coupled to the imaging device structure. The through silicon vias may couple imaging device circuitry in the imaging device structure to the conductive bumps.

What is to be claimed:

1. An integrated circuit package:
   a package substrate; and
   an image sensor die formed on the package substrate in a flip chip configuration, wherein the image sensor die has a first side that is in contact with an electrical connection and a second side that opposes the first side;
   a glass lid attached on the second side of the image sensor die such that an air gap is formed between the glass lid and the image sensor die;
   a metal interconnect that is formed in the first side of the image sensor die and that is coupled to the electrical connection; and
   a through-silicon via that is coupled to the metal interconnect and that extends only partially through the image sensor die.

2. The integrated circuit package defined in claim 1, further comprising:
   a ball grid array coupled to the package substrate, wherein the ball grid array comprises a plurality of solder balls.

3. The integrated circuit package defined in claim 2, wherein the image sensor die comprises an imaging device structure and a carrier layer, wherein the carrier layer includes metal interconnects that are coupled to the ball grid array.

4. The integrated circuit package defined in claim 3, wherein the electrical connection comprises:
   a plurality of conductive bumps interposed between the carrier layer and the package substrate.

5. The integrated circuit package defined in claim 4, wherein the plurality of conductive bumps are coupled to the ball grid array without redistribution layers formed at the first side of the image sensor die.

6. The integrated circuit package defined in claim 1, further comprising:
   an attachment structure interposed between the glass lid and the image sensor die.

7. The integrated circuit package defined in claim 1, further comprising:
   package sealing material that at least partially surrounds the glass lid and the image sensor die.

8. The integrated circuit package defined in claim 7, further comprising:
   underfill material that is disposed between the carrier layer and the package substrate and that is formed from the same material as the package sealing material.

9. The integrated circuit package defined in claim 1, wherein the image sensor die comprises a backside illuminated (BSI) image sensor die configured to receive light via its second side.

10. A method of forming an integrated circuit package, comprising:
    forming an image sensor die having a first surface at which conductive bumps are formed and a second surface that opposes the first surface;

forming a through-silicon via that extends only partially through the image sensor die;

attaching a glass layer to the second surface of the image sensor die; and mounting the image sensor die on a package substrate in a flip chip arrangement such that the first surface is facing the package substrate.

11. The method defined in claim 10, further comprising:

forming a solder ball grid array coupled to the package substrate.

12. The method defined in claim 11, wherein the image sensor die comprises an imaging device structure formed over a carrier layer, wherein the carrier layer comprises metal interconnects, further comprising:

forming conductive bumps on the carrier layer that are coupled to the metal interconnects, wherein the metal interconnects couples the conductive bumps to the through-silicon via.

13. The method defined in claim 10, further comprising:

depositing package sealing material on the package substrate around the glass layer and the image sensor die.

14. The method defined in claim 13, wherein depositing the package sealing material comprises depositing the package sealing material between the image sensor die and the package substrate with the package sealing material.

15. The method defined in claim 10, wherein mounting the glass layer to the image sensor die comprises applying an adhesive layer between the glass layer and the image sensor die.

16. A system, comprising:

a central processing unit;

memory;

input-output circuitry; and an imaging device, comprising;

a package substrate; and an image sensor die that has a first surface and a second surface different from the first surface and that is formed over the package substrate in a flip chip configuration so that the first surface is attached to the package substrate;

metal routing paths formed in the first surface of the image sensor die;

a through-silicon via that is coupled to the metal routing paths and that terminates before reaching the first surface of the image sensor die; and a glass lid mounted directly on the second side of the image sensor die.

17. The system defined in claim 16, wherein the image sensor die comprises a backside illuminated image sensor die configured to receive light through its second side.

18. The integrated circuit package defined in claim 1, wherein the electrical connection comprises solder.

* * * * *